US006969286B1

(12) United States Patent
Mongold et al.

(10) Patent No.: US 6,969,286 B1
(45) Date of Patent: *Nov. 29, 2005

(54) CONNECTOR HAVING IMPROVED CONTACTS WITH FUSIBLE MEMBERS

(75) Inventors: John A. Mongold, Middletown, PA (US); Stephen P. Koopman, Floyds Knobs, IN (US)

(73) Assignee: Samtec, Inc., New Albany ( * ) Notice: Subject to any disclaimer, the term of this patent is extended or adjusted under 35 U.S.C. 154(b) by 0 days.

This patent is subject to a terminal disclaimer.

(21) Appl. No.: 10/969,582

(22) Filed: Oct. 20, 2004

Related U.S. Application Data

(63) Continuation of application No. 10/876,740, filed on Jun. 28, 2004.

(51) Int. Cl.$^7$ ............................................. H01R 4/02
(52) U.S. Cl. ................................. 439/874; 439/875
(58) Field of Search ........................ 439/83, 874, 875, 439/876; 228/180.22

(56) References Cited

U.S. PATENT DOCUMENTS

| | | |
|---|---|---|
| 4,089,106 A | 5/1978 | Seidler |
| 4,120,558 A | 10/1978 | Seidler |
| 4,139,256 A | 2/1979 | Seidler |
| 4,203,648 A | 5/1980 | Seidler |
| 4,592,617 A | 6/1986 | Seidler |
| 4,597,625 A | 7/1986 | Seidler |
| 4,597,628 A | 7/1986 | Seidler |
| 4,605,278 A | 8/1986 | Seidler |
| 4,679,889 A | 7/1987 | Seidler |
| 4,697,865 A | 10/1987 | Seidler |
| 4,728,305 A | 3/1988 | Seidler |
| 4,737,115 A | 4/1988 | Seidler |
| 4,738,627 A | 4/1988 | Seidler |
| 4,747,794 A | 5/1988 | Seidler |
| 4,752,250 A | 6/1988 | Seidler |
| 4,778,231 A | 10/1988 | Seidler |
| 4,780,098 A | 10/1988 | Seidler |
| 4,802,862 A | 2/1989 | Seidler |
| 4,883,435 A | 11/1989 | Seidler |
| 4,932,876 A | 6/1990 | Seidler |
| 5,030,144 A | 7/1991 | Seidler |
| 5,052,954 A | 10/1991 | Seidler |
| 5,090,926 A | 2/1992 | Seidler |
| 5,139,448 A | 8/1992 | Seidler |
| 5,246,391 A | 9/1993 | Seidler |
| 5,307,929 A | 5/1994 | Seidler |
| 5,310,367 A | 5/1994 | Seidler |
| 5,334,059 A | 8/1994 | Seidler |

(Continued)

FOREIGN PATENT DOCUMENTS

DE          3712691          6/1988

(Continued)

OTHER PUBLICATIONS

Teka Interconnection Systems, "PCMCIA Connectors With Solder-Bearing Leads/PCMCIA Solder-Bearing Lead Connector Soldering Equipment," pp. 1-10, Providence, Rhode Island, 1992.

(Continued)

Primary Examiner—Tho D. Ta
(74) Attorney, Agent, or Firm—Keating & Bennett, LLP

(57) ABSTRACT

An electrical connector includes a connector body, a plurality of cores and a plurality of electrically conductive contacts disposed in the cores of the connector body. Each of the contacts includes a fusible member attached thereto. Each of the fusible members includes an intermediate portion and two support members disposed on opposite sides of the intermediate portion. The support members are arranged to hang down below a tail portion of the contacts.

47 Claims, 14 Drawing Sheets

U.S. PATENT DOCUMENTS

| | | | |
|---|---|---|---|
| 5,344,343 A | 9/1994 | Seidler | |
| 5,419,710 A | 5/1995 | Pfaff | |
| 5,441,429 A | 8/1995 | Seidler | |
| 5,441,430 A | 8/1995 | Seidler | |
| 5,556,293 A | 9/1996 | Pfaff | |
| 5,571,034 A | 11/1996 | Seidler | |
| 5,601,459 A | 2/1997 | Seidler | |
| 5,611,705 A | 3/1997 | Pfaff | |
| RE35,549 E | 7/1997 | Seidler | |
| 5,653,617 A * | 8/1997 | Seidler | 439/876 |
| 5,688,150 A | 11/1997 | Seidler et al. | |
| 5,785,555 A * | 7/1998 | O'Sullivan et al. | 439/610 |
| 5,875,546 A | 3/1999 | Cachina et al. | |
| 5,908,323 A | 6/1999 | Seidler | |
| 5,910,885 A | 6/1999 | Gulachenski et al. | |
| 5,997,317 A | 12/1999 | Pei et al. | |
| 6,016,254 A | 1/2000 | Pfaff | |
| 6,024,584 A | 2/2000 | Lemke et al. | |
| 6,079,991 A | 6/2000 | Lemke et al. | |
| 6,093,035 A | 7/2000 | Lemke et al. | |
| 6,099,365 A | 8/2000 | Cachina et al. | |
| 6,116,923 A * | 9/2000 | Szu | 439/83 |
| 6,139,336 A | 10/2000 | Olson | |
| 6,164,983 A | 12/2000 | Lemke et al. | |
| 6,247,635 B1 | 6/2001 | Olson | |
| 6,325,644 B1 | 12/2001 | Lemke et al. | |
| 6,325,682 B1 | 12/2001 | Seidler | |
| 6,328,577 B1 | 12/2001 | Azuma | |
| 6,352,437 B1 | 3/2002 | Tate | |
| 6,354,850 B1 | 3/2002 | Harper, Jr. et al. | |
| 6,402,574 B2 | 6/2002 | Cachina et al. | |
| 6,425,771 B1 | 7/2002 | Shirai et al. | |
| 6,471,526 B1 | 10/2002 | Harper, Jr. | |
| 6,485,313 B1 | 11/2002 | Lu et al. | |
| 6,494,725 B2 | 12/2002 | Lin et al. | |
| 6,494,754 B2 | 12/2002 | Cachina et al. | |
| 6,501,665 B1 | 12/2002 | Ted | |
| 6,530,788 B1 | 3/2003 | Ju | |
| 6,533,590 B1 | 3/2003 | Lee et al. | |
| 6,543,129 B2 | 4/2003 | Cachina et al. | |
| 6,558,170 B1 | 5/2003 | Lemke | |
| 6,565,368 B1 | 5/2003 | Liao et al. | |
| 6,572,397 B2 | 6/2003 | Ju | |
| 6,595,788 B2 | 7/2003 | Harper, Jr. et al. | |
| 6,623,284 B1 | 9/2003 | Korsunsky | |
| 6,641,410 B2 | 11/2003 | Marvin et al. | |
| 6,644,985 B2 | 11/2003 | Wilson et al. | |
| 6,669,489 B1 | 12/2003 | Dozier, II et al. | |
| 6,679,709 B2 | 1/2004 | Takeuchi | |
| 6,692,265 B2 | 2/2004 | Kung et al. | |
| 6,702,594 B2 | 3/2004 | Lee et al. | |
| 6,712,626 B2 | 3/2004 | Harper, Jr. et al. | |
| 2001/0041481 A1 | 11/2001 | Cachina et al. | |
| 2001/0045009 A1 | 11/2001 | Cachina et al. | |
| 2002/0058446 A1 | 5/2002 | Cachina et al. | |
| 2002/0061687 A1 | 5/2002 | Cachina et al. | |

FOREIGN PATENT DOCUMENTS

| | | |
|---|---|---|
| EP | 0 591 772 | 9/1993 |
| EP | 0 706 240 | 10/1994 |
| EP | 0 782 220 | 12/1996 |
| EP | 0 843 383 | 11/1997 |
| JP | 02-278893 | 11/1990 |
| JP | 06-072663 | 3/1994 |
| WO | WO 96/42123 | 12/1996 |
| WO | WO 97/45896 | 12/1997 |
| WO | WO 98/15990 | 4/1998 |

OTHER PUBLICATIONS

"Integrated Surface Mount Module I/O Attach," Research Disclosure, Aug. 1990, No. 316, Kenneth Mason Publications Ltd, England.

"Solder Ball Connect Pin Grid Array Package (34235)" "Coordination of Engine Mount With Controlled Suspension (34236)" "Bond Pad Metallurgy for Wire Bonding (34237)," Research Disclosure, Oct. 1992, No. 342, Kenneth Mason Publications Ltd, England.

Martyak, J.E. et al., "Connector-Interposer for Module-To-Board Connection," IBM Technical Disclosure Bulletin, Jan. 1972, p. 2297, vol. 14, No. 8.

Rivenburgh, D.L. and R.J. Romanosky, "Cast-Solder Preloading for Stacked Modules," IBM Technical Disclosure Bulletin, Jul. 1977, pp. 545-546, vol. 20, No. 2.

"Application of Precision Solder Volumes to Suface Pads," IBM Technical Disclosure Bulletin, Apr. 1990, pp. 38-39, vol. 32, No. 11.

Kazmierowicz, P. "SMT Applications: Profiling Your Solder Reflow Oven in Three Passes or Less," Surface Mount Technology, Feb. 1990, pp. 61-62.

Kazmierowicz, P. "The Science Behind Conveyor Oven Thermal Profiling," KIC Oven Designs, Embedded Designs Inc, 1992, pp. 1-8.

Indium Corporation of America, Product Data Sheet, "Integrated Solder Preforms", one page, Jan. 2000.

* cited by examiner

CONNECTOR HAVING IMPROVED CONTACTS WITH FUSIBLE MEMBERS

This application is a Continuation application of prior application Ser. No. 10/876,740, filed Jun. 28, 2004, now abandoned.

BACKGROUND OF THE INVENTION

1. Field of the Invention

The present invention relates to electrical connectors and more specifically, the present invention relates to connectors having a unique arrangement of contacts or terminals having a fusible member attached thereto, that allows for much higher coplanarity while simplifying the connector manufacturing and assembly procedures.

2. Description of the Related Art

Electrical connectors are used to place electrical devices, such as printed circuit boards, in communication with one another. An electrical connector may be thought of as having two portions, one portion of which connects to a first electrical device and the second portion of which connects to a second electrical device to be put into communication with the first device. To connect the two devices, the two portions of the electrical connector are mated together.

Each portion of the connector includes one set of contacts or terminals adapted to communicatively couple to an electronic device and a second set of contacts or terminals adapted to matingly couple to the other connector portion. This can be readily accomplished by designating one portion of the connector as having "male" contacts or terminals adapted to couple to the other connector portion's "female" contacts or terminals. Regardless of the specifics of the design of the contacts or terminals, the two connector portions should be adapted to be easily connected and disconnected from each other to respectively electrically link and unlink the electrical devices to which they are connected.

Accordingly, each connector portion is fixedly connected to an electronic device through its remaining set of contacts or terminals. The contacts or terminals may be removably or permanently connectable to the electrical device; however, it is usually desired that the connector portion be secured to the electrical device through some physical mechanism. Typically, the connector portions are secured to electrical devices by fusing the contacts or terminals to contact pads or the like formed on the electrical device.

Recently, there has been a trend toward miniaturization of most electrical devices. As electrical devices become smaller and more complex, the electrical connectors used with these devices must also become smaller and must be able to accommodate the more complex devices. One problem with miniaturized electrical connectors arises from the increased precision of placement necessary to produce the proper positioning and connection of the connector contacts or terminals onto the device. This problem is exacerbated by the ever increasing input/output (I/O) density requirements demanded of the progressively smaller electrical connectors by increasingly miniaturized electrical devices. With increased pin counts (e.g., greater number of terminals) in each connector, it becomes more and more difficult to maintain desired levels of co-planarity while maintaining contact of all of the terminals to a substrate or PCB.

One means of addressing the need for increased I/O density is to provide an arrayed connector. Such a connector can provide a high-density two-dimensional array of contacts or terminals for interfacing with an electrical device. However, arrayed connectors present attachment difficulties regarding connection to devices (i.e., circuit boards or substrates) since most of the contacts or terminals must necessarily be positioned in the interior of the two-dimensional array area and are accordingly difficult to align upon connection, visually inspect, and/or repair.

One attempt to provide a high-density electrical connector interface has been to use a ball grid array (BGA). The BGA offers the advantages of a precisely formed high-density array of contacts or terminals available to interconnect with a substrate. The use of a BGA is thought to overcome conventional problems with co-planarity (e.g., to maintain co-planarity at about 0.004", for example) and to ensure that all contacts or terminals are securely soldered to pads on a PCB when the connector is mounted and reflowed to the PCB.

However, the use of a BGA has many disadvantages. First of all, the use of solder balls greatly complicates the connector manufacturing process because an additional reflow step is required and the use of special equipment is also required. In addition, either the connector body and/or contacts or terminals must be modified to include recesses or solder ball holding structures, or special assembly equipment must be used to hold the solder balls in place until the solder balls can be reflowed to be connected to the tails of conductive contacts or terminals provided in the housing of the connector. After the solder balls have been reflowed a first time so as to be attached to the tails of the contacts or terminals, the entire connector must be reflowed again so that the solder balls can make the necessary electrical and mechanical attachments to conductive pads on a PCB upon which the connector is being mounted. A further problem may occur when the solder balls are attached to gold-plated tail portions of the contacts or terminals, during which process the gold of the tail portions of the contacts or terminals can mix with the tin/lead of the reflowed solder ball which can cause problems with gold embrittlement.

In addition to the above-described problems, variations in the dimensions and/or placement of solder balls at the interface can lead to an uneven or non-coplanar interface and intermittent or poor electrical contact. Also, the presence of oversized or extra solder balls present in the connector interface, or the uncontrolled spreading of the solder balls during the multiple reflow steps can result in shorted connections and degraded connector performance. In addition, the tails of the contacts or terminals are inserted and attached at different depths within the various solder balls so as to create problems with co-planarity. Furthermore, the solder joints created by the solder balls between the contacts or terminals and the pads on the PCB is not as reliable and may not withstand twisting or distortion of the connector body which may occur. That is, the solder joints created using solder balls are not as flexible and may not withstand the stresses applied to the joints when the connector body bows, twists or is distorted in shape.

One alternative to the use of a BGA is described in U.S. Pat. No. 6,679,709, in which circular columns of solder 6 are used instead of solder balls. The circular columns of solder 6 have an elongated cylindrical bar-shaped configuration and in fact are formed by cutting pieces of solder wire. These circular columns of solder 6 are inserted between a pair of bar-like pieces 12 which are then bent to allow claws 13 to grip and hold the solder 6 on the respective terminal or pin 5 such that a longitudinal axis of the circular column of solder 6 is perpendicular to a mounting plane of a PCB or circuit board to which the solder 6 and connector is to be attached. Thus, the solder holding assembly (elements 12, 13, 14) must be arranged perpendicular to the main body 10 of the contact or terminal 5, which complicates the manufacturing and assembly of the contacts or terminals 5 in the connector body. In addition, because the circular columns of solder 6 may have different lengths and may be mounted at different positions with the solder holding assembly (12, 13, 14) of each terminal, many problems with co-planarity may result. Thus, this complicated tail assembly of the contacts or terminals 5 makes manufacturing and assembly more difficult and may cause rather than solve co-planarity problems.

Another alternative is the use of solder-bearing contacts in which the solder has been crimped to the contacts, as shown in U.S. Pat. No. 4,597,628, for example. In this patent, a solder bearing edge clip 10 has arms 15, 16 with arcuate fingers 18, 19 having solder wires 30 attached thereto. The attaching process involves inserting solder wires 30 into openings at the ends of the fingers 18, 19, closing or crimping the fingers to close the openings so as to indent the solder wires 30 as shown in FIGS. 3 and 12. The solder is then melted to attach the arms 15, 16 or 75, 76 to the pads 12 of the substrate 11 as seen in FIGS. 4 and 13. In most of the embodiments shown in this patent, the solder wire is spaced from the outer surfaces of the fingers 18, 19 or 68, 69 because the fingers 18, 19 or 68, 69 must be able to reliably hold the substrate. FIGS. 11A and 11B show an embodiment where the solder wire 71' projects very slightly from the finger ends so that when the substrate is inserted, the solder wipes across the contact pad 12 to improve the resulting solder joint. However, with this structure, there is no way to control how far the solder projects from the finger ends and thus, no way to ensure that the substrate is reliably held in the arms. If the finger ends are crimped too much, excessive solder will project from the finger ends and it may not be possible to reliably hold the substrate between the fingers. If the finger ends are not crimped enough, the solder will not project from the finger ends. In addition, if fingers 18, 19 or 68, 69 are bent, twisted or having varying dimensions due to manufacturing tolerances, there may be an air gap between the pads 12 and the fingers 18, 19 or 68, 69 and solder. This air gap may not be filled by the solder during reflow because the solder may not be sufficiently wicked or moved toward the pad during reflow. Thus, there may still be problems with reliably forming or soldering electrical connections between fingers 18, 19 or 68, 69 and the pads 12.

In fact, this is one of the most significant problems with electrical connectors in which conductive contacts or terminals are to be joined to conductive elements on a substrate. Because of twisting or flexing of the connector or variations in size, shape, or arrangement of the contacts or terminals in a connector body, an air gap may exist between the contact or terminal and a conductive pad to which it is to be attached before the reflow process is performed. The current designs and arrangements of contacts or terminals in the connectors do not provide for a consistently reliable solution for eliminating the air gap during reflow, and do not ensure that each contact or terminal is securely connected to the conductive pad on a substrate to which the connector is mounted.

SUMMARY OF THE INVENTION

In order to overcome the unsolved problems of the prior art described above, preferred embodiments of the present invention provide an electrical connector that allows for much greater co-planarity to be achieved and also allows for a much more reliable reflow process to be performed to reliably connect a connector to a substrate.

According to a preferred embodiment of the present invention, an electrical connector includes a connector body, a plurality of contacts arranged in the connector body, each of the plurality of contacts having a tail portion with a fusible member attached thereto, wherein each of the fusible members includes an intermediate portion and two support members disposed on opposite sides of the intermediate portion, and the two support members extend below the tail portion of the contact.

It is preferred that each of the two support members extends below the tail portion of the contact by a distance of about 0.004 inches to 0.014 inches, and that an outer periphery of each of the two support members is greater than an outer periphery of the tail portion of the contact.

Furthermore, it is preferred that the two support members are arranged to wick up the tail portion of the contact in a direction toward the connector body during a reflow process. When this happens, the portions of the support portions that previously hung below the bottom tip of the tail portion moves up the tail portion such that there is no longer any portion of the fusible member that hangs down below the bottom tip of the tail portion. As a result, each contact or terminal and the entire connector is able to drop down such that the bottom tip of the tail portion is located very close to the substrate and is reliably attached to the substrate. This allows the connector to have much greater co-planarity and a much more reliable reflow process.

The configuration and arrangement of the contact or terminals has additional unique features. It is preferred that the contact or terminal has a key hole defined by a first horizontally extending arc and two vertically extending arcs, such that the intermediate portion of the fusible member is fitted within the key hole. More specifically, the intermediate portion of the fusible member fills the keyhole defined by the first horizontally extending arc and the two vertically extending arcs. This allows the fusible member to be quickly and reliably attached to the contact or terminal and eliminates a reflow step required with BGA connectors.

The contacts or terminals may also include a solder stop portion located at a medial portion thereof. In addition, the tail portions of the contacts are substantially straight and do not include a right angle portion as is required with some conventional contacts described above.

The contacts or terminals may also include wings for engaging a core of the connector body to maintain a uniform distance between the tail portion of the contacts and the connector body.

Also, the contacts or terminals may include wedges for engaging a side wall of a core of the connector body in order to fix the contact in the connector body.

Furthermore, the contacts or terminals may include lead-in portions having coined edges arranged to position the contacts in the connector body.

The contacts or terminals may also include bumps for positioning the contacts within the connector body.

The fusible member also has unique features in addition to those described above. Each of the two support portions has one of a substantially flat bottom surface, a substantially rounded bottom surface, a substantially spherical bottom surface, a substantially conical bottom surface, a substantially rectangular bottom surface and a substantially square bottom surface. Also, the intermediate portion and the two support portions are integral and unitary, and the support portions are located on opposite sides of the tail portion of the contact.

Each of the two support members extends from the intermediate portion and is larger than the intermediate portion. The two support members preferably have substantially the same size and shape.

It should be noted that the above-described unique arrangement and construction of the fusible member attached to the contacts or terminals of a connector can be applied to any type of connector including a board-to-board mezzanine connector, a differential pair array connector, a single ended array connector, an edge card connector, a right angle connector, a wafer for use in a backplane connector system, a connector for use with an IC chip such as a microprocessor chip (e.g., a Pentium® socket) and any other type of connector.

Another preferred embodiment relates to a connector assembly in which a connector according to the preferred embodiments described above is attached to a substrate, such as a PCB. In such a structure, the unique contacts or terminals with attached fusible members are arranged to be mounted on and attached to conductive elements on the substrate.

A further preferred embodiment of the present invention provides a method of forming a connector including the steps of providing a contact having a tail portion, inserting a fusible member into the tail portion, pressing edges of the fusible member such that an intermediate portion and two support portions of the fusible member are formed such that the two support portions extend down below a bottom tip of the tail portion of the contact. The resulting intermediate portion, two support portions and the arrangement thereof on the tail portion of the contact preferably have the features described above with respect to the other preferred embodiments of the present invention described above.

Yet another preferred embodiment of the present invention provides a method of mounting a connector to a substrate, in which the connector manufactured according to the method described in the preceding paragraph, is positioned above a substrate such that a respective one of the contacts is located directly above a respective one of a plurality of conductive elements formed on the substrate, and reflowing the connector and substrate such that the fusible members are melted causing the support portions of the fusible members to wick up the contacts away from the tail portions, resulting in the contacts and the connector dropping down toward the substrate, such that the contacts are electrically connected to the conductive elements formed on the substrate.

Other features, elements, steps, characteristics, and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described with reference to the drawings.

Figure 1A:
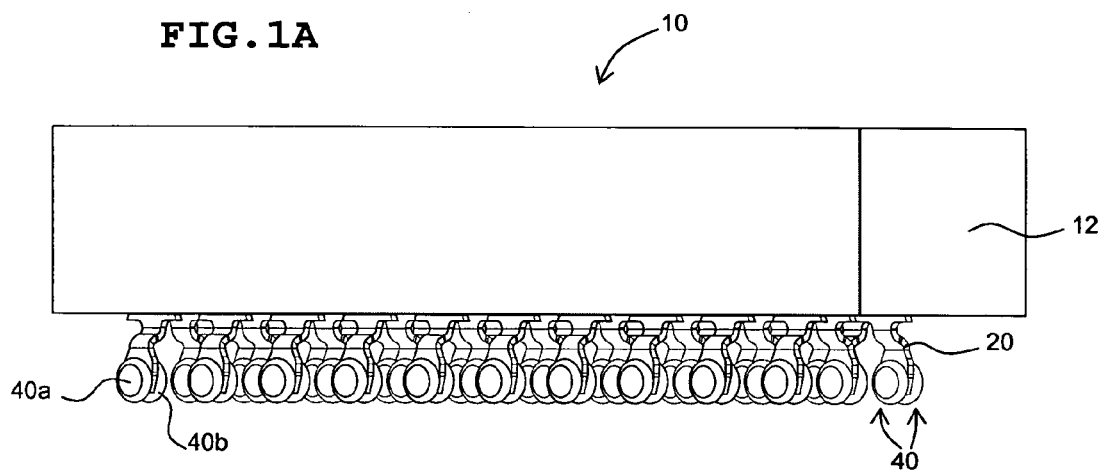
FIG. 1A is an isometric view of a connector according to a preferred embodiment of the present invention.
Figure 1B:
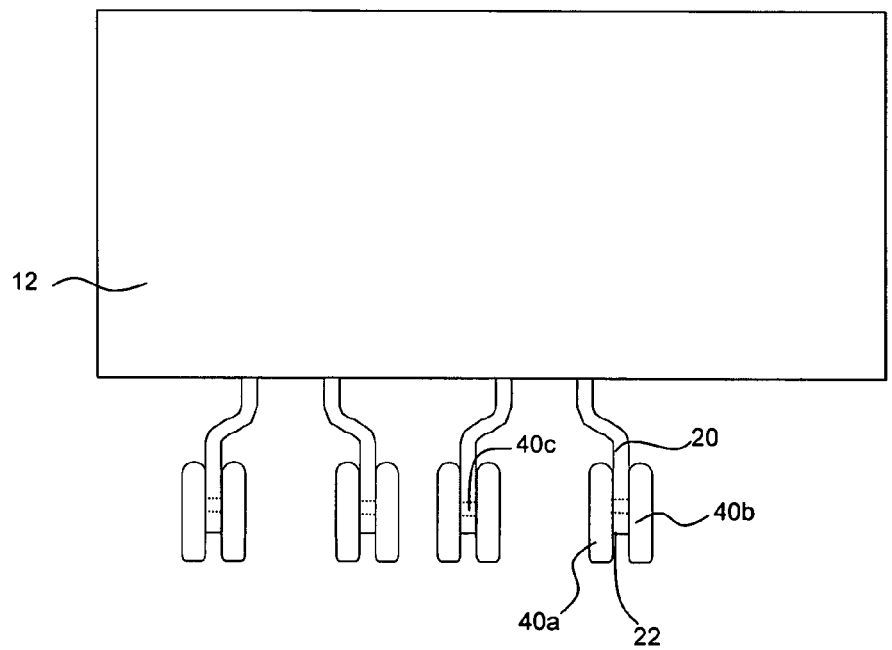
FIG. 1B is an end view of the connector of FIG. 1A.

FIG. 1A is an isometric view and FIG. 1B is an end view of a connector 10 according to a first preferred embodiment of the present invention. The connector 10 includes a body 12 that is preferably made of an insulating material such as plastic, a plurality of cores (not shown in FIGS. 1A and 1B, but shown as element 14 in FIG. 9 which illustrates another preferred embodiment of the present invention) formed in the connector body 12 for receiving a plurality of contacts, and a plurality of contacts or terminals 20 inserted into the cores and held in the body 12. It should be noted that the connector 10 is shown in FIGS. 1A and 1B in a state before being reflowed to be attached to a substrate such as a PCB.

As seen in FIGS. 1A and 1B, each of the contacts or terminals 20 includes a fusible member 40 that is fixed to a tail portion 22 of the contact 20. It should be noted that the fusible member 40 can preferably be a conductive material that can be melted by a reflow process, such as solder or other suitable metal. In addition, the fusible member 40 can be a flux coated solder material member or a flux core solder wire. Preferred embodiments of the present invention will be described with reference to solder wires constituting the fusible member 40, but this is in no way limiting of the present invention.

Each fusible member 40 has two support portions 40a, 40b which are connected to each other by an intermediate portion 40c. The two support portions 40a, 40b are disposed opposite to each other and spaced from each other by a distance that is equal to a length of the intermediate portion 40c. The two support portions 40a, 40b may preferably have substantially flattened bottom surfaces as shown in FIG. 1B. However, the bottom surfaces of the support portions 40a, 40b may also have other shapes such as rounded, spherical, conical, square, rectangular, and other suitable shapes.

It is preferred that the support portions 40a, 40b be formed such that an outer periphery of each of the support portions 40a, 40b is greater than an outer periphery of the tail portion 22 of the contact or terminal 20, as seen in FIGS. 1A and 1B, for example. This feature along with other unique features of the arrangement of the fusible member 40 attached to the contact or terminal 20 enables the connector 10 to achieve much greater co-planarity as will be described.

Figure 2A:
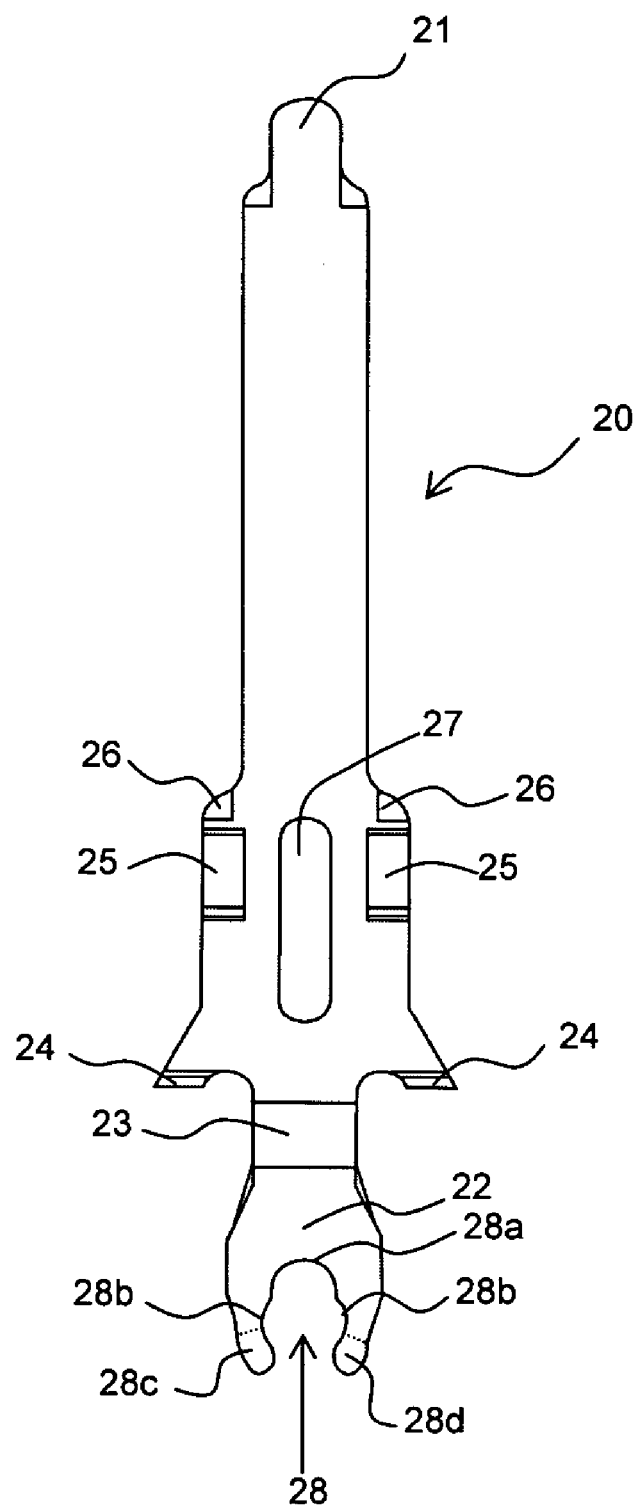
FIG. 2A is an end view of a contact or terminal according to another preferred embodiment of the present invention.
Figure 2B:
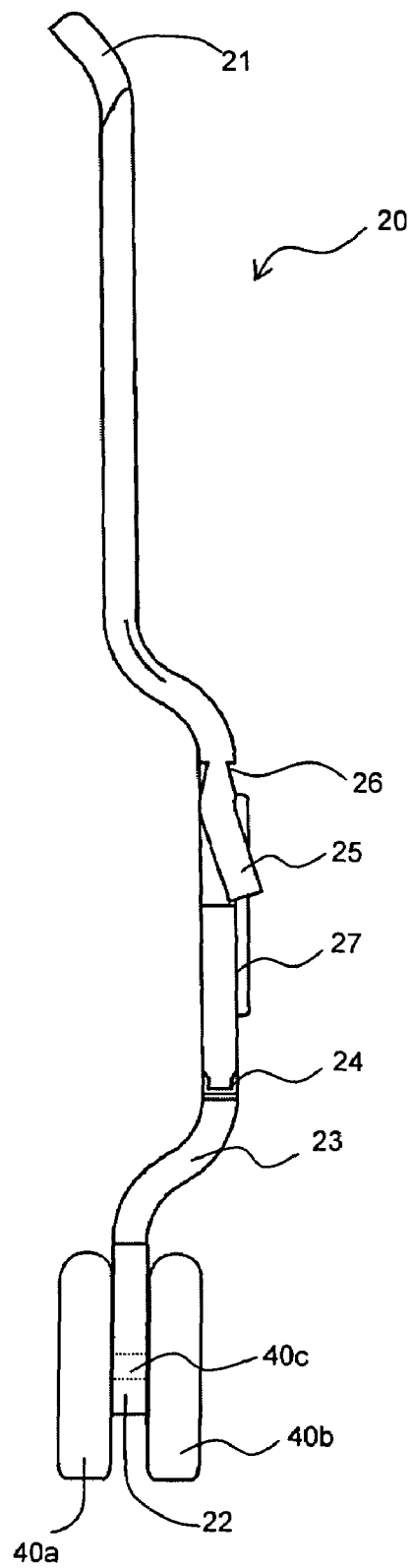
FIG. 2B is a side view of a contact or terminal according to the preferred embodiment of the present invention shown in FIG. 2A.

One of the unique features of the combined contacts or terminals 20 and fusible members 40 is that the lower portions of the two support portions 40a, 40b extend or hang down well below the end or bottom tip of the tail portion 22 of the contact or terminal 20 as seen in FIGS. 1B and 2B. As will be described below, this is an important feature for allowing the much higher coplanarity and a much more effective reflow process for joining the connector 10 to a substrate such as a PCB.

The intermediate portion 40c is fixedly held in the tail portion 22 of the contact 20 and the opposed support portions 40a, 40b are disposed on opposite sides of the tail portion 22 of the contact 20 as seen in FIG. 1B. The two support portions 40a, 40b and the intermediate portion 40c are preferably integral and unitary, as a result of being formed from the same fusible member as will be described below.

Before describing the preferred process for manufacturing the connector 10 shown in FIGS. 1A and 1B, a preferred construction of the contact or terminal 20 will be described with reference to FIGS. 2A and 2B.

FIG. 2A is an end view and FIG. 2B is a side view of the contact or terminal 20 according to another preferred embodiment of the present invention, for use with the connector 10 shown in FIGS. 1A and 1B. FIG. 2A shows the contact or terminal 20 without the fusible member 40 affixed thereto and FIG. 2B shows the contact or terminal 20 with the fusible member 40 affixed thereto.

The contacts or terminals 20 preferably include a contact portion 21 and the tail portion 22 at the opposite end. In a medial portion of the contact or terminal 20, a solder stop member 23 is preferably provided to prevent the fusible material, such as solder, from wicking up toward the contact portion 21. The solder stop member 23 may be formed of any suitable material such as nickel or bare copper alloy. Other anti-wicking agents like resist films or any other non-solder wettable material like flourine resist may also be used. In addition, the medial portion of the contact or terminal 20 preferably includes wings 24 for engaging the bottom of the core of the connector body 12 in order to maintain a consistent distance between the tail portion 22 of the contact or terminal 20 and the connector body 12.

The medial portion of the contact or terminal 20 may also preferably include wedges 25 for engaging a side wall of a core in order to fix the position of the contact or terminal 20 and retain the contact or terminal 20 in the core of the connector body 12. The wedges 25 fix the contact or terminal 20 in the core in the width direction of the connector body 12 so as to prevent stress from being applied in a length direction of the connector body 12 so as to prevent problems with co-planarity.

The medial portion of the contact 20 also preferably includes lead-ins or chamfers 26 which are formed by coined edges which facilitate insertion of the contacts or terminals 20 into the cores of the connector body 12. Each of the contacts or terminals 20 further preferably includes a bump 27 for positioning and stabilizing the contact or terminal 20 in a desired position and orientation relative to the connector body 12.

The contact or terminal 20 also preferably includes a key hole 28 at the tail portion 22. The key hole 28 has a unique configuration that serves a special function as will be described. The key hole 28 is preferably defined by one horizontally extending arc portion 28a and two vertically extending arc portions 28b disposed opposite to each other. The arc portions 28a and 28b cut out of the tail portion form two retaining arms 28c, 28d. The tips of the two retaining arms 28c, 28d are preferably beveled so as to eliminate debris from the fusible member 40 during the manufacture of the contact or terminal 20. More specifically, the tips of the tail portion 22 at the retaining arms 28c and 28d are preferably coined to a chamfered tip at the surfaces below the dotted lines on the retaining arms 28c and 28d. This is to facilitate the insertion and pushing through of the fusible member 40 into the keyhole 28, and prevents the retaining arms 28c, 28d from removing or displacing portions of the fusible member 40 that could build up at the tail portion 22 or more specifically, at the two retaining arms 28c, 28d.

FIG. 2B shows a side view of the contact or terminal 20 of FIG. 2A with a fusible member 40 being affixed thereto as will be described in more detail below. As seen in FIG.

2B, the lower portion of the support portions 40*a*, 40*b* extend down well below the bottom tip of the tail portion 22 of the contact or terminal 20.

In preferred embodiments of the present invention, the distance between the bottom tip of the tail portion 22 and the bottom surface of the support portions 40*a*, 40*b* is preferably in the range of about 0.004 to about 0.014 inches. This distance between the bottom tip of the tail portion 22 and the bottom surface of the support portions 40*a*, 40*b* allows for the unique drop-down function of the fusible members 40 and contacts or terminals 20. The assembly shown in FIG. 2B is before a reflow process is performed during which the fusible member 40 melts. Thus, when the assembly shown in FIG. 2B is placed on a substrate, such as a PCB, before reflow, the support portions 40*a* and 40*b* rest on the substrate and the bottom tip of the tail portion 22 is spaced from the substrate by about 0.004 to about 0.014 inches. During the reflow process, the fusible material from support portions 40*a*, 40*b* wicks up the tail portion 22 of the contact or terminal 20 toward the solder stop portion 23. When this happens, the portion of the support portions 40*a*, 40*b* that previously hung below the bottom tip of the tail portion 22 moves up the tail portion 22 such that there is no longer any portion of the fusible member 40 that hangs down below the bottom tip of the tail portion 22. As a result, each contact or terminal 20 and the entire connector 10 is able to drop down such that the bottom tip of the tail portion 22 is located very close to the substrate and is reliably attached to the substrate. This will be described in more detail later.

A preferred process for manufacturing and assembling the contacts or terminals 20 having the unique fusible member bearing tail portions 22 will now be described with reference to FIGS. 3–4H.

Figure 3:
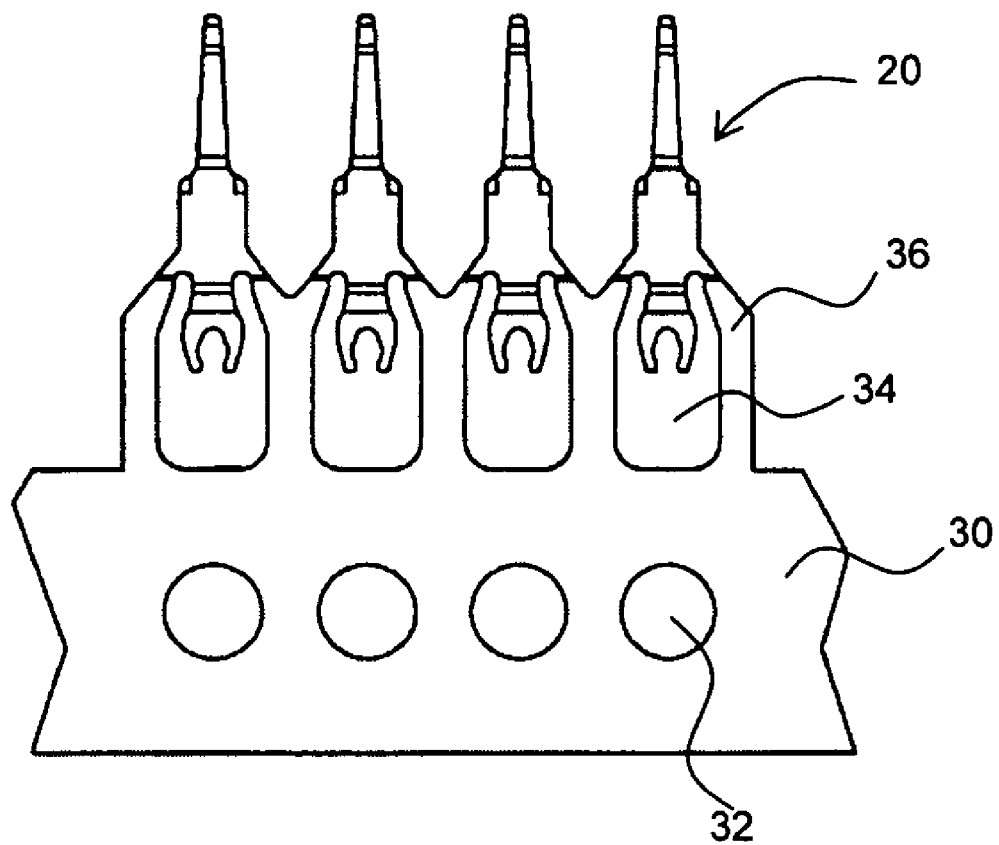
FIG. 3 is an assembly view of a plurality of contacts or terminals on a carrier strip for use in preferred embodiments of the present invention.

As seen in FIG. 3, a plurality of contacts or terminals 20 can be formed simultaneously and can be mass produced by stamping the contacts or terminals 20 from a suitable material such as any copper alloy. The contacts or terminals 20 are preferably held on a carrier strip 30 for ease of assembling the fusible members 40 to the contacts or terminals 20. The carrier strip 30 includes contact-holding members 36 arranged such that there is a space or opening 34 between the carrier strip 30 and the contacts or terminals 20. In addition, the carrier strip 30 includes a plurality of holes 32 which are used to position, hold and feed the carrier strip 30.

Figure 4A:
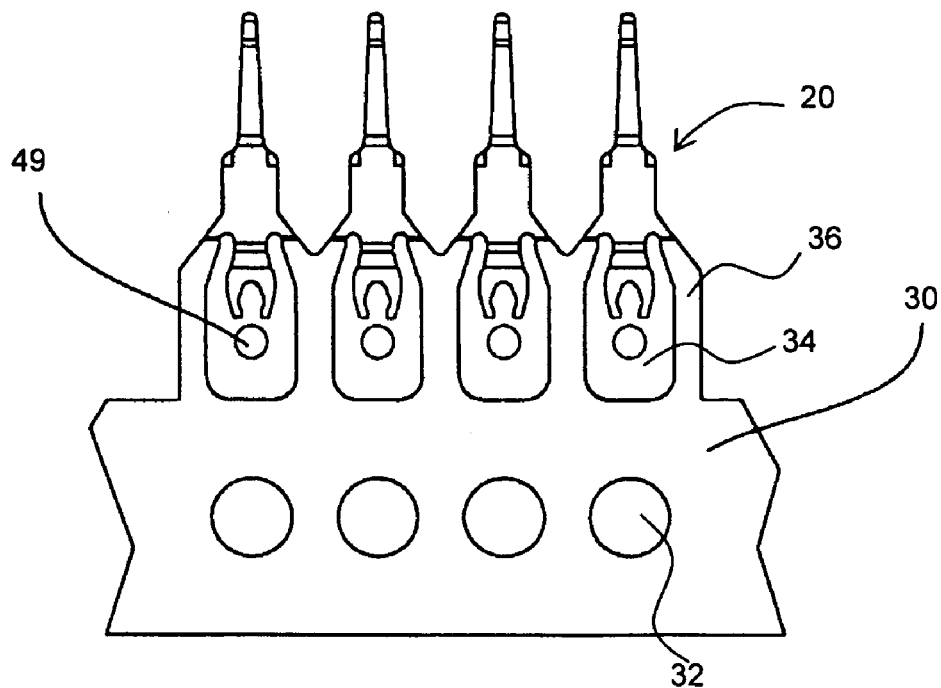
FIG. 4A shows a first assembly step for joining a fusible member to a tail of a contact or terminal wherein a fusible member is positioned at an opening in the carrier strip just below the tails of the contacts or terminals.

As seen in FIG. 4A, the carrier strip 30 including a plurality of contacts or terminals 20 is held in position such that a fusible member 40, in this case, preferably a solder wire 49 for forming the fusible members 40, can be moved into the opening 34 to a location just below the key hole 28 of the contacts or terminals 20. As seen in FIG. 4A, the solder wire 49 is inserted into the opening 34 formed between the carrier strip 30 and the contacts or terminals 20 so that the solder wire 49 can be inserted into the key hole 28. The insertion of the solder wire 49 into the key hole 28 preferably involves a press-fitting operation.

Figure 4B:
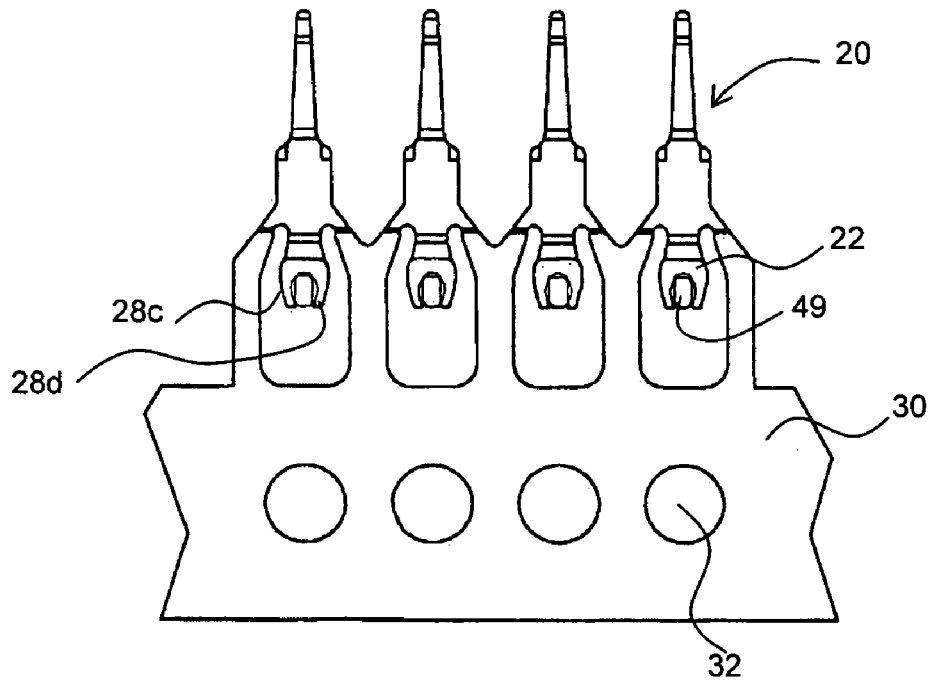
FIG. 4B shows a second assembly step for joining a fusible member to a tail of a contact or terminal wherein the fusible member is inserted in the tails of the contacts or terminals.
Figure 4C:
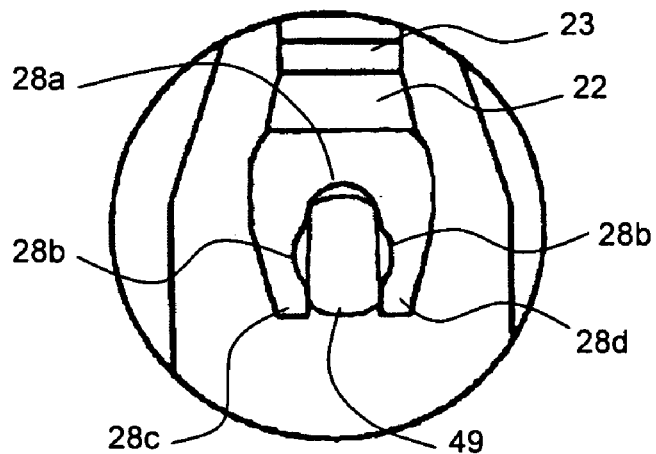
FIG. 4C shows a close-up detailed view of a fusible member having been joined to the tail of a contact or terminal as a result of the step shown in FIG. 4B being performed.

As seen in FIG. 4B, the solder wire 49 is moved upwardly into the key hole 28 such that the solder wire 49 for forming the fusible member 40 is press fit and held in the key hole 28 by the retaining arms 28*c* and 28*d*. It is not necessary bend or crimp the retaining arms 28*c*, 28*d* toward each other to hold the fusible member 40 because the dimensions of the key hole 28 allow for press-fitting of the fusible member 40 into the arc portions 28*a*, 28*b* of the key hole 28 at the tail portion 22. As can be seen in FIG. 4C, the solder wire 49 does not initially completely fill the arc portions 28*a* and 28*b*.

Figure 4D:
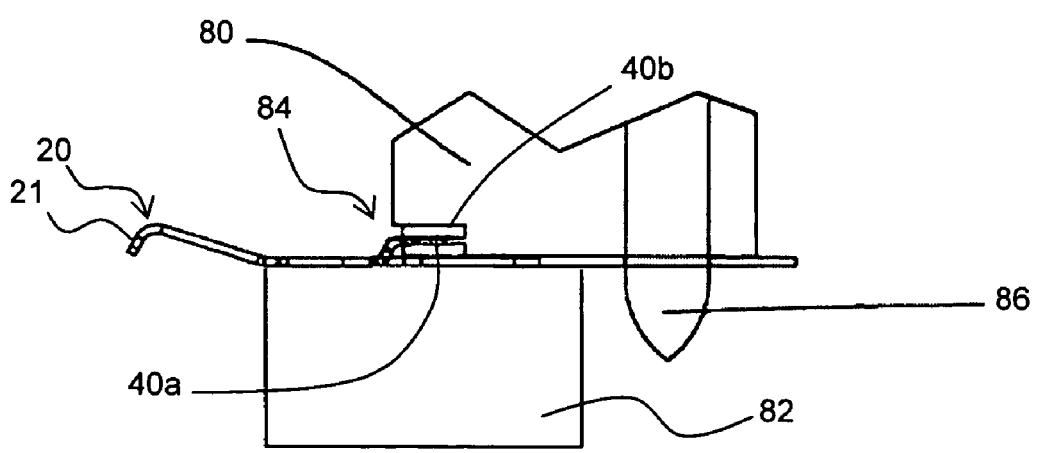
FIG. 4D shows a third assembly step for joining a fusible member to a tail of a contact or terminal wherein the fusible member is pressed at opposite ends thereof.
Figure 4E:
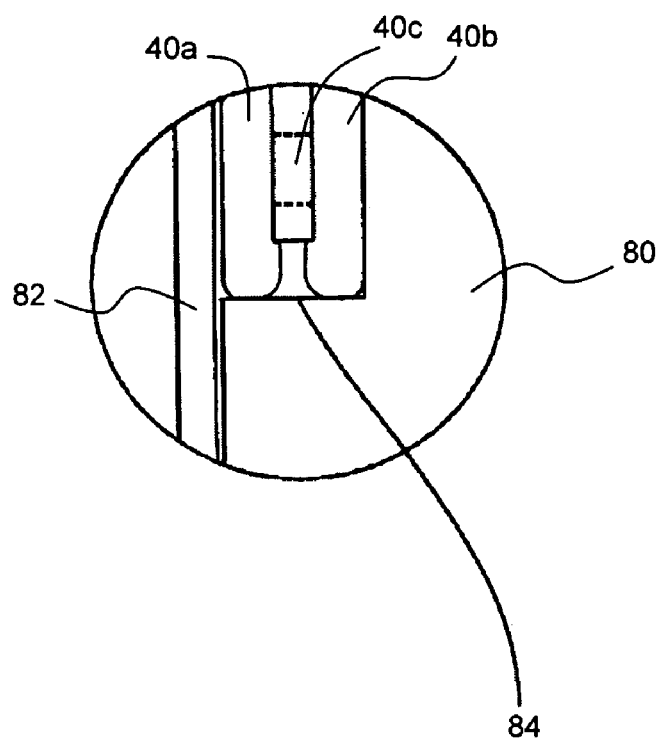
FIG. 4E shows a close-up detailed view of the resulting support portions formed by the step of pressing the opposite ends of the fusible member as a result of the step shown in FIG. 4D being performed.
Figure 4F:
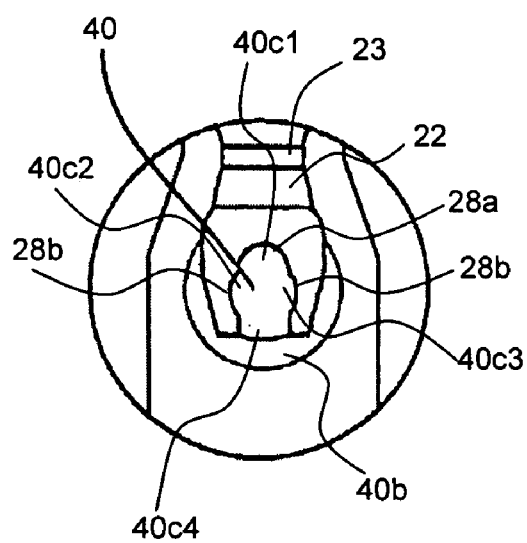
FIG. 4F shows a close-up detailed view of the resulting intermediate portion filling the arc portions of the tail of the contacts or terminals as a result of the step shown in FIG. 4D being performed.

As seen in FIG. 4D, the opposite ends of the solder wire 49 held in the tail portion 22 of the contact or terminal 20 are simultaneously pressed toward each other by a press or ram 80 and a support 82, such that the two oppositely disposed support portions 40*a*, 40*b* are formed. The ram 80 has a cut-out portion 84 which corresponds to a desired shape of the support portions 40*a*, 40*b*. The carrier strip 30 is held by a positioning pin 86 for accurate positioning of the contact or terminal 20 within the press 80. This is shown in more detail in FIG. 4E. The shape of the support portions 40*a*, 40*b* can be changed as desired by changing the shape and configuration of the cut-out portion 84 of the ram 80. The intermediate portion 40*c* of the fusible member 40 between the two support portions 40*a*, 40*b* is held in the arc portions 28*a*, 28*b* of the tail portion 22 during the pressing of the two opposite ends of the fusible member 40. As a result of the forces applied by the press or ram 80 and the support 82 to form the two support portions 40*a*, 40*b*, the intermediate portion 40*c* is distorted so as to fill the arc portions 28*a*, 28*b* of the tail portion 22 as shown in FIG. 4F. This ensures that the fusible member 40 is reliably held in the tail portion 22 of the contact or terminal 20.

It is important to note in FIG. 4E that the pressing of the fusible member 40 in the press or ram 80 allows for highly precise control of the amounts of the support portions 40*a*, 40*b* that hang down below the bottom tip of the tail portions 22 of the contacts or terminals 20. As seen in FIG. 4E, the support portions 40*a*, 40*b* are pressed against the cut-out portion 84 such that the amount of the fusible member 40 extending down below the bottom tip of the tail portion 22 is precisely determined and formed, thereby enabling uniform assemblies of fusible members 40 attached to contacts or terminals 20 to be formed. As a result, when a connector 10, which includes such unique assemblies of contacts or terminals 20 having fusible members 40 attached thereto, is reflowed to a PCB 60, much greater co-planarity is achieved.

Figure 4G:
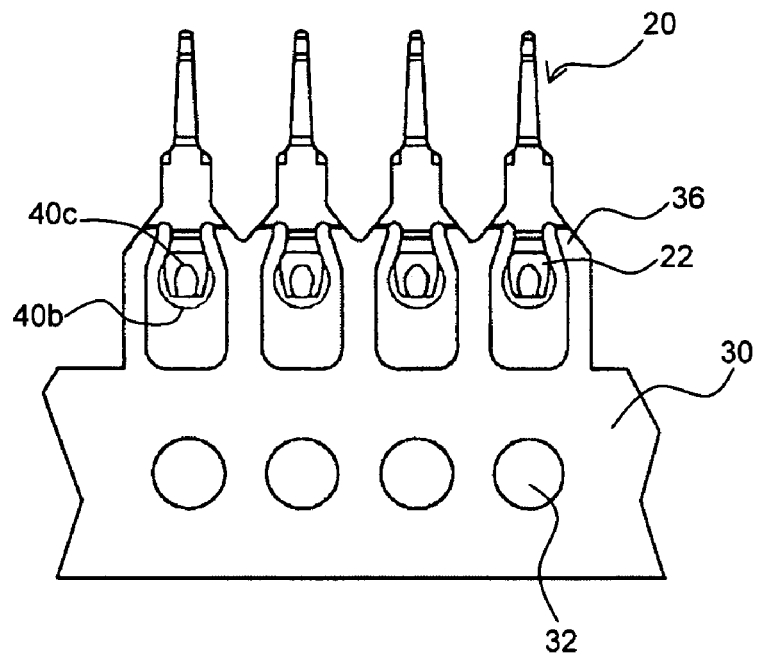
FIG. 4G shows a detailed section view of the fusible member bearing tails of the contacts or terminals as a result of the step shown in FIG. 4D being performed.
Figure 4H:
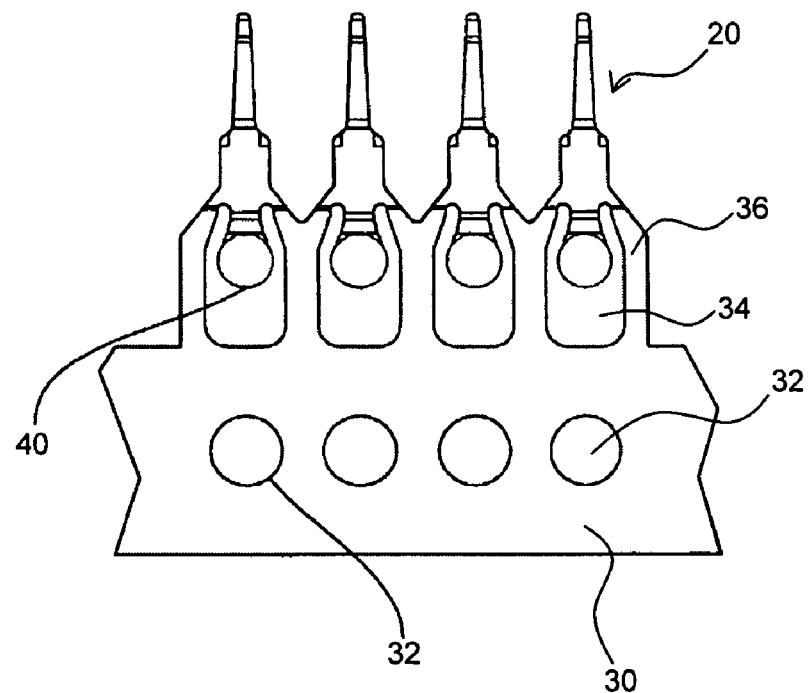
FIG. 4H shows a detailed side view of the fusible member bearing tails of the contacts resulting from the step shown in FIG. 4D.

FIGS. 4G and 4H show the completion of the process for mounting the fusible member 40 in the contact or terminal 20. As seen in the detail of FIG. 4G, the resulting fusible member 40 is arranged in the contact or terminal 20 such that the two support portions 40*a*, 40*b* extend well below the bottom tip or end of the tail portion 22. This is very important for allowing for greatly increased co-planarity and ensuring a reliable reflow process when the connector 10 is joined to a substrate such as a PCB.

As is seen in the detail of FIG. 4F, the resultant fusible member 40 has a unique shape and configuration. The intermediate portion 40*c* has a shape that substantially corresponds to the shape of the key hole 28. That is, the intermediate portion 40*c* includes a horizontally extending arc portion 40*c*1, two vertically extending arc portions 40*c*2, 40*c*3, and substantially rectangular end portion 40*c*4. The unique shape and various portions 40*c*1, 40*c*2, 40*c*3 included in the intermediate portion 40*c* reliably holds the fusible member 40 in the tail portion 22 of the contact or terminal 20.

In addition, as seen in FIGS. 1A and 4E, the use of the ram 80 produces the unique shape of the support portions 40*a*, 40*b*. As noted above, in one preferred embodiment, the support portions 40*a*, 40*b* preferably include a substantially flattened portion on the bottom surface thereof. However, other shapes of the bottom surfaces may also be used for the bottom surfaces of the support portions 40*a*, 40*b*. The unique shape of the intermediate portion 40*c* is important for reliably holding the fusible member 40 in the tail portion 22 of the contact or terminal 20, and allows for easy assembly of the fusible member 40 to the contact or terminal 20.

The unique configuration of the two support portions 40a, 40b including the lower portions hanging down from the intermediate portion 40c in relation to the bottom tips of the tail portions 22 of the contact or terminals 20 is very important for allowing the connector to drop down, due to gravity, during the reflow process, which allows for much higher than normal coplanarity and a much more effective reflow process because all of the contacts or terminals 20 are successfully and reliably reflowed and electrically connected to respective pads 62, as will be described below. This unique drop down action is not possible with conventional connectors described above.

It is preferred that the distance between the bottom tip of the tail portion 22 and the bottom surface of the support portions 40a, 40b is in the range of about 0.004 to about 0.014 inches. The reason this range is selected is as follows.

When assembling the fusible member 40 on the contact or terminal 20, it is necessary to ensure that the fusible member 40 is reliably held on the contact or terminal 20 until the reflow process is performed. During assembly of the fusible member 40 to the contact or terminal 20, one of the goals is to fill key hole 28, and especially the key hole portion 28b with the fusible material of the fusible member 40, in order to prevent the fusible member from falling off of the tail portion 22 of the contact or terminal 20. If the amount of the fusible member 40 hanging down below the bottom tip of the tail portion 22 is greater than about 0.014 inches, it may not be possible to place the fusible member 40 far enough into the key hole 28 to allow the key hole 28 to reliably hold the fusible member and the fusible member 40 may fall off of the contact or terminal 20. If the amount of the fusible member 40 hanging down below the bottom tip of the tail portion 22 is less than about 0.004 inches, the contacts or terminals 20 and the entire connector 10 may not experience an adequate amount of drop, as described above, which could result in a lack of connection between a contact or terminal 20 and a conductive pad or element on a substrate.

Once the unique construction of the contacts or terminals 20 including the fusible members 40 affixed thereto is completed as described above, the contacts or terminals 20 are inserted and preferably press-fit into cores of the connector body 12 to complete the connector 10. Instead of being press fit in the connector body 12 as described above, the pins can also be insert-molded.

In this manner, the fusible members 40 are easily and securely press-fit and pressed to the contacts or terminals 20 instead of being attached by reflowing a solder ball or other solder member thereto as in conventional methods, and then the contacts or terminals 20 are easily inserted into the connector body 12. As a result, the tail portions 22 of the contacts or terminals 20 may be tin-plated, if desired, which eliminates or minimizes the gold embrittlement problems of the prior art.

Figure 5A:
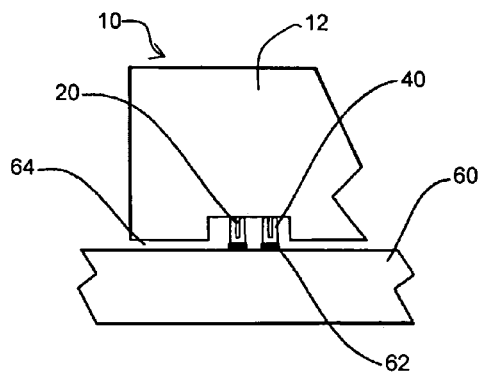
FIG. 5A is an end view of a connector according to a preferred embodiment of the present invention being mounted on a PCB before a reflow process.
Figure 5B:
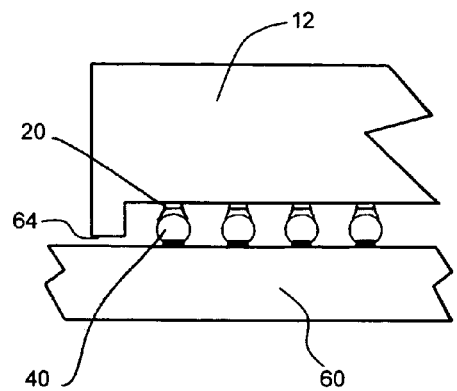
FIG. 5B is a side view of a connector according to a preferred embodiment of the present invention being mounted on a PCB before a reflow process.

FIGS. 5A, 5B, 6A, and 6B show how the connector 10 having the contacts or terminals 20 with the attached fusible members 40 described above is mounted to a substrate such as a PCB. FIGS. 5A and 5B show the connector 10 placed on the PCB 60 before a reflow process is performed to join the connector 10 to the PCB 60. As can be seen in FIGS. 5A and 5B, the connector 10 is placed on the PCB 60 such that the two support portions 40a, 40b of each contact or terminal 20 are placed on a respective pad 62 of the PCB 60. Flux or solder paste (not shown) may be applied on the pads 62 prior to reflow for improving the connection between the contact or terminal 20 and the PCB 60.

A gap 64 exists between the connector body 12 and the PCB 60. The unique structure of the fusible members 40 allow for two different areas of contact and connection for securing each fusible member 40 to each pad 62 as seen in FIG. 5A. More specifically, the two support portions 40a, 40b are located on two different, spaced portions of a respective pad 62. This increases the area of contact between the fusible member 40 and the pad 62, and enables each contact or terminal 20 to be reliably and securely connected, both mechanically and electrically, to the respective pad 62. Thus, by increasing the area of contact between the fusible member 40 and the pad 62, a stronger solder joint is ensured.

When the connector 10 is placed on the PCB 60 before the reflow process as shown in FIG. 5A, the support members 40a, 40b allow the fusible members to rest on the PCB 60. Because the fusible members 40 are reliably connected to the contacts or terminals 20 via press-fitting and pressing to form the support members 40a, 40b and the intermediate portion 40c as described above, a reflow step for connecting the fusible members 40 to the contacts or terminals 20 is not required, as is conventionally necessary with BGA connectors. In addition, because the lower portions of fusible members 40 hang down well below the tip of the tail portion 22 of the contacts or terminals 20, a large portion of the contact or terminal 20 extends outside of the connector housing 12 which increases the ability of the contacts or terminals 20 to flex and endure thermal cycling and other forces applied to the connector 10 without experiencing any problems. Thus, the area of the solder joint formed between the contacts or terminals 20 and the PCB pads 62 via the fusible members 40 is much greater and has a greater ability to flex and withstand forces applied thereto. In addition, because the contacts or terminals 20 are formed by stamping and the fusible member 40 is force-fit and compressed to be joined to the contact or terminal 20, the contacts or terminals 20 having the fusible members 40 joined thereto can be formed much more easily and accurately. As a result, when the contacts or terminals 20 with the fusible members 40 are inserted into the connector body 12, the distance from the connector body 12 to the tips of the tail portions 22 of the fusible members 40 is uniform for all of the contacts or terminals 20 which allows for the higher coplanarity achieved by preferred embodiments of the present invention.

Figure 6A:
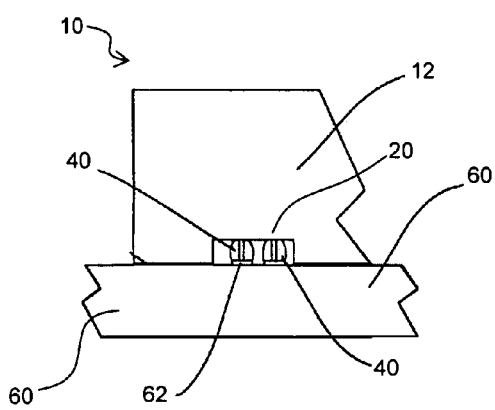
FIG. 6A is an end view of a connector according to a preferred embodiment of the present invention being mounted on a PCB after a reflow process.
Figure 6B:
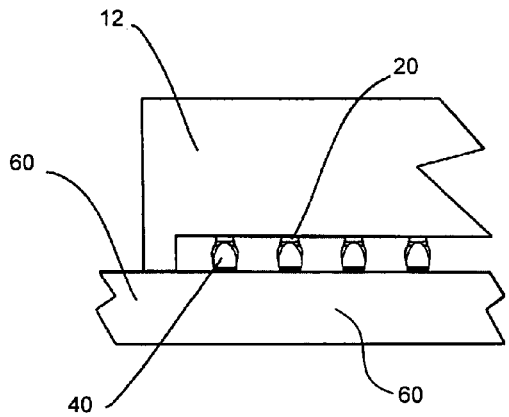
FIG. 6B is a side view of a connector according to a preferred embodiment of the present invention being mounted on a PCB after a reflow process.

FIGS. 6A and 6B show the connector 10 and PCB 60 after a reflow process has been performed. During the reflow process, the support portions 40a, 40b and intermediate portion 40c melt. The fusible material from the intermediate portion 40c completely fills any remaining small voids in the key hole 28 of the tail portion 22 thereby reinforcing the mounting of the fusible member 40 to the contact or terminal 20 and thereby increasing the strength of the resulting solder joint. The fusible material of the two support portions 40a, 40b located below the intermediate portion 40c wicks upward along the tail portion 22 of the contact 20 allowing the two support members 40a, 40b to be secured directly on the PCB pads 62. During the reflow process, because of the fusible members 40 being press-fit to the tail portions 22 of the contact or terminals 20 and the fusible members 40a, 40b extending below the tail portions 22, the connector 10 and contacts or terminals 20 drop down such that the contacts or terminals 20 are located much closer to the PCB pads 62.

As can be seen in FIG. 6B, all of the terminals or terminals 20 are reliably connected to the pads 62 of the PCB 60 via the solder joints formed by the two support portions 40a, 40b of the fusible member 40 because of the increased effectiveness of the reflow process due to the unique configuration of the contacts or terminals 20 and fusible members 40.

Figure 7A:
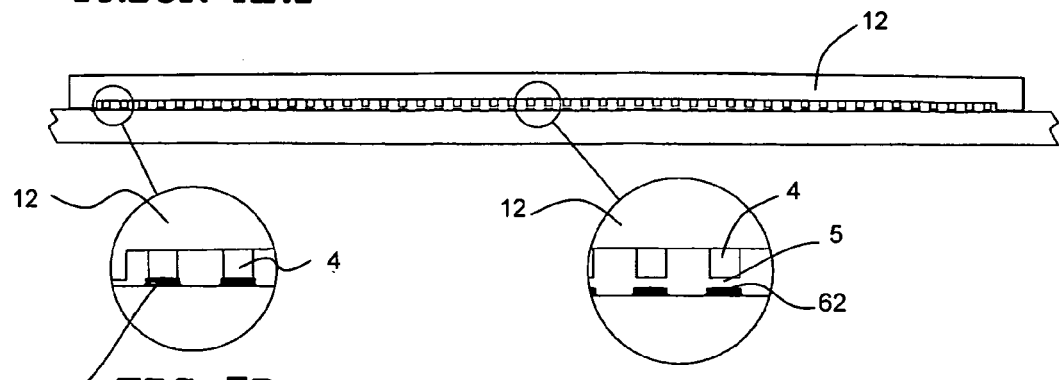
FIG. 7A is a schematic view of a conventional connector having tail portions of the contacts or terminals aligned with pads of a PCB before a reflow process for joining the connector to the PCB is performed.
Figure 7B:
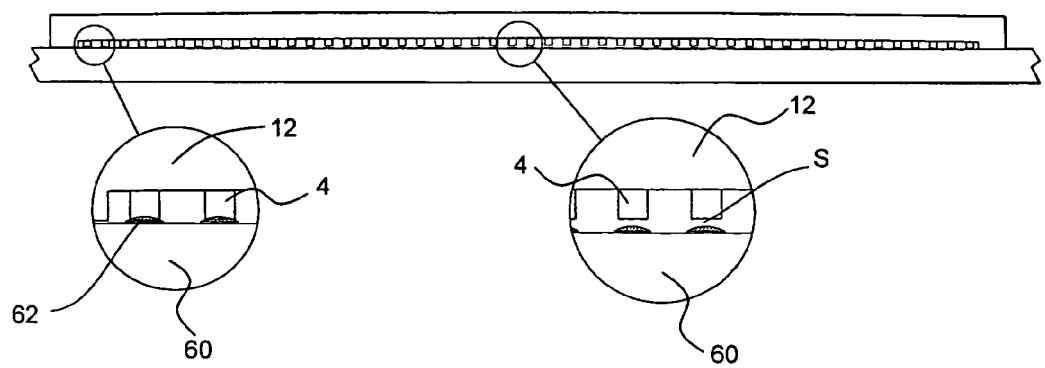
FIG. 7B is a schematic view of a conventional connector having the tail portions of the contacts or terminals being attached to a PCB after a reflow process for joining the connector to the PCB is performed.

FIGS. 7A and 7B show views of a conventional connector prior to the reflow process in FIG. 7A and after the reflow process in FIG. 7B. As seen in FIG. 7A, the connector body 12 has bowed or flexed such that many of the contacts or terminals 20 are spaced from the pads 62 on the PCB 60. This bowing or flexing of the connector 10 can be caused by (1) bowing or flexing that may occur during molding of the connector body 12; (2) stress being relieved during either or both of the two separate reflow steps required with the prior art connector; (3) stress applied when press-fitting the contacts into the housing; and (4) manufacturing tolerances. As seen in FIG. 7A, when the connector body 12 is bowed or flexed, many of the contacts or terminals 20 are unevenly spaced from the PCB 60 before the reflow step.

Even after reflow has been performed, as seen in FIG. 7B, many of the contacts or terminals 20 are spaced a distance S from pads 62 on the PCB 60 such that many of the contacts or terminals 20 are not connected to the pads 62 on the PCB 60. Thus, the co-planarity and electrical connections provided by the solder joint are very poor in the connector shown in FIGS. 7A and 7B.

Figure 8A:
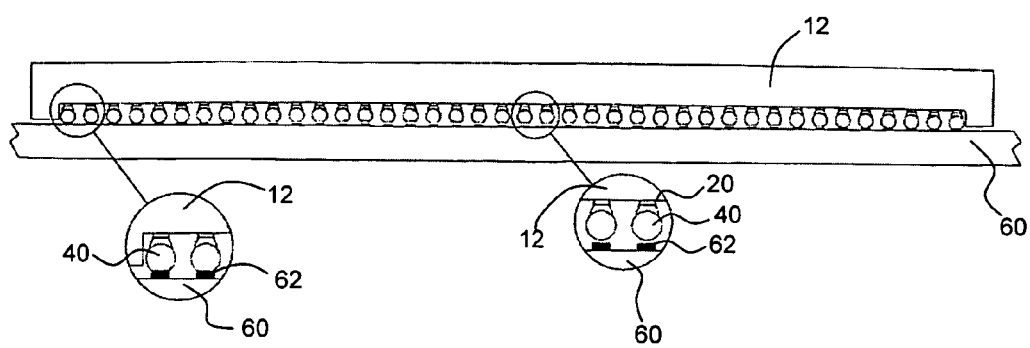
FIG. 8A is a schematic view of a connector according to a preferred embodiment of the present invention having fusible member bearing tails being placed on a PCB before a reflow process for joining the connector to the PCB is performed.
Figure 8B:
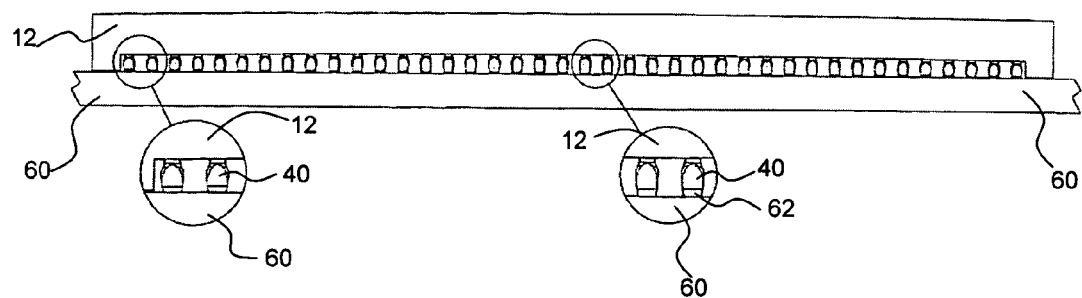
FIG. 8B is a schematic view of a connector according to a preferred embodiment of the present invention having fusible member bearing tails being connected to a PCB after a reflow process for joining the connector to the PCB is performed.

FIGS. 8A and 8B are similar figures to FIGS. 7A and 7B, but show how a preferred embodiment of the present invention is connected to a PCB 60 and overcomes the problems with the connector shown in FIGS. 7A and 7B. As seen in FIG. 8A, the connector body 12 has bowed and distorted prior to reflow (FIG. 8A) in a manner similar to the conventional connector shown in FIG. 7A. Despite the presence of a bowed or flexed connector body 12, after the reflow process has been performed in FIG. 8B, each of the contacts or terminals 20 are reliably connected to pads 62 on the PCB 60 after reflow despite the bowing and flexing of the connector body 12.

As seen by comparing the results shown in FIGS. 7B and 8B, the connector 10 according to preferred embodiments of the higher co-planarity and a much more reliable reflow process, and eliminates the problems with contacts or terminals 20 not being connected to the respective conductive elements on the substrate 60.

Although the connector 10 shown in FIGS. 1–6B is preferably a board-to-board mezzanine type connector, the present invention is not limited thereto.

Figure 9:
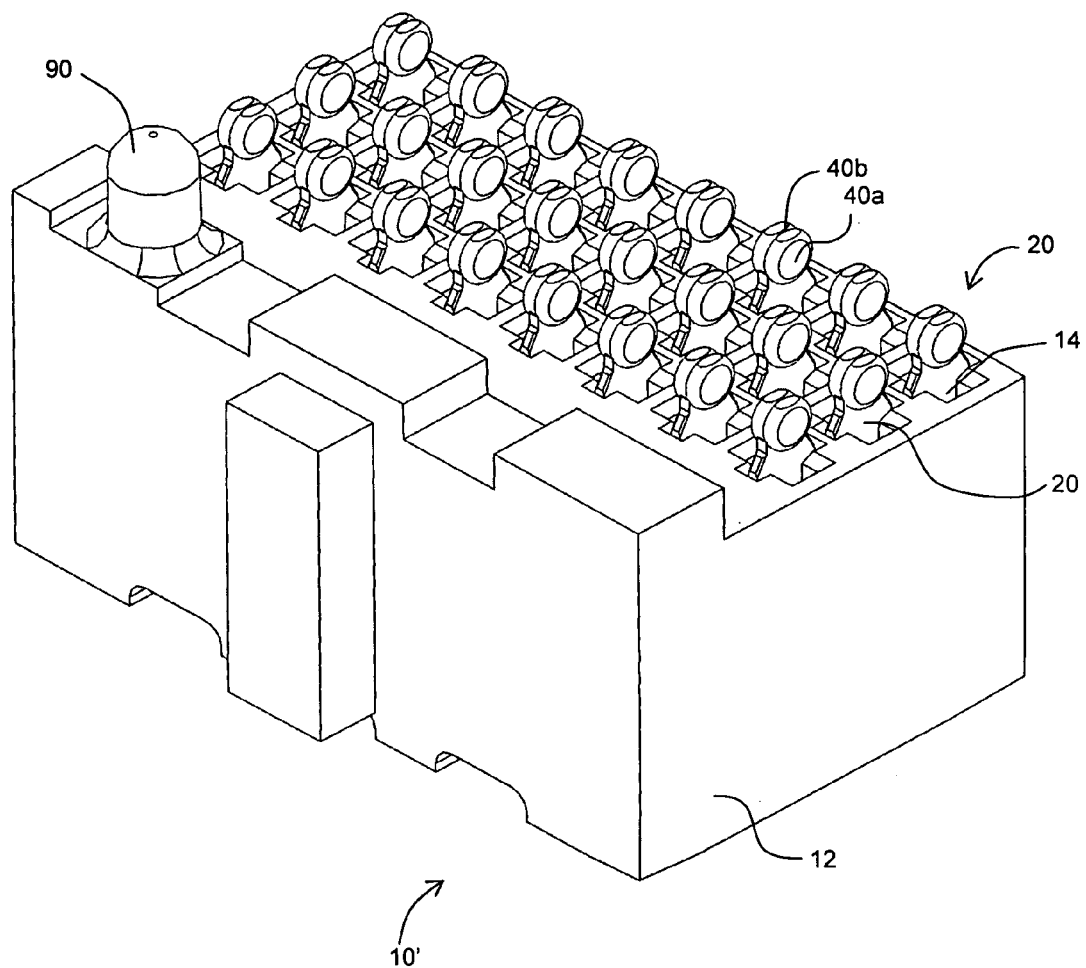
FIG. 9 is an isometric view of a mezzanine connector according to a further preferred embodiment of the present invention, which includes fusible member bearing contacts or terminals of preferred embodiments of the present invention.
Figure 10:
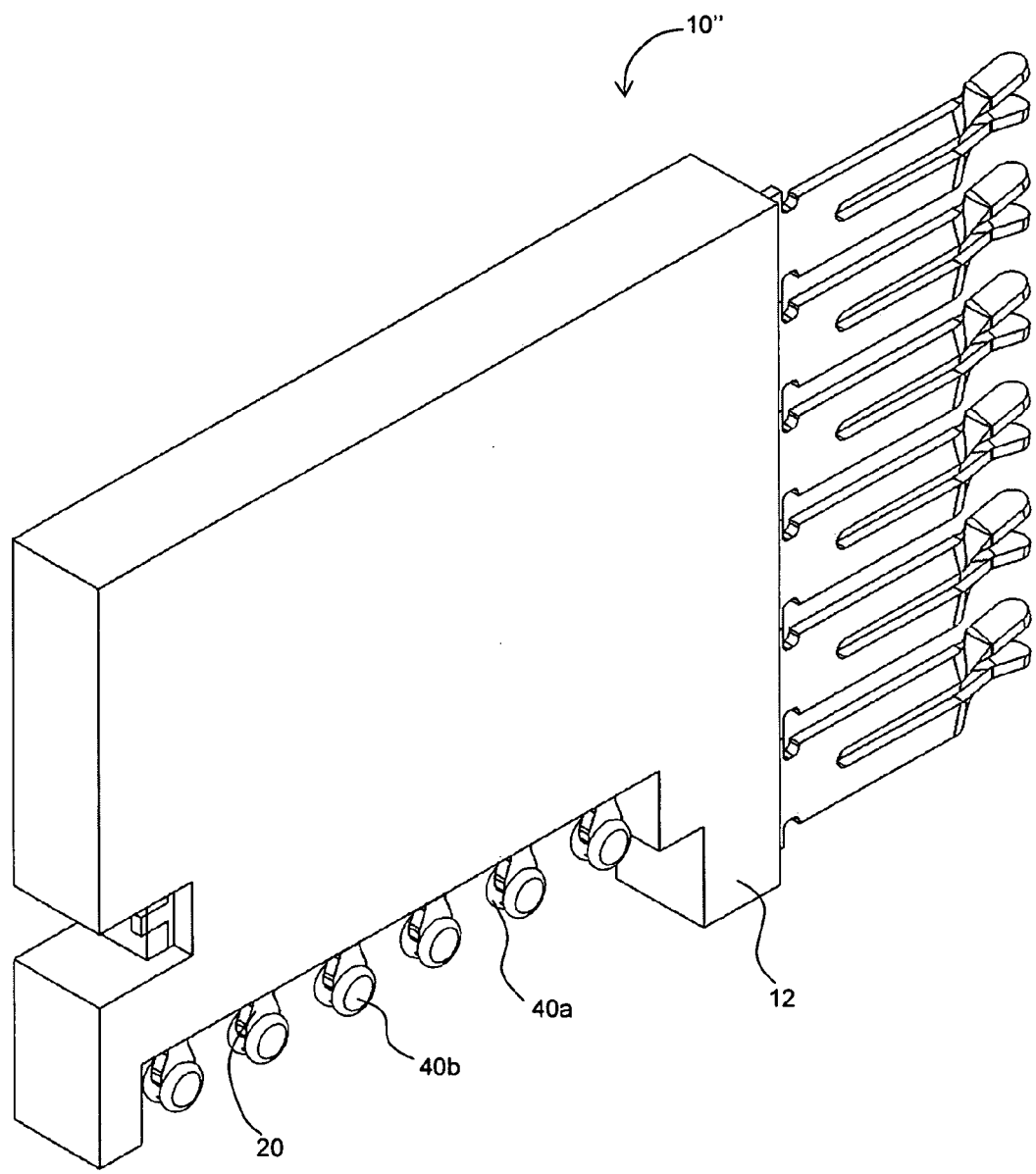
FIG. 10 is an isometric view of an edge card wafer with fusible member bearing contacts or terminals of the preferred embodiments of the present invention for use in a backplane connector according to another preferred embodiment of the present invention.
Figure 11A:
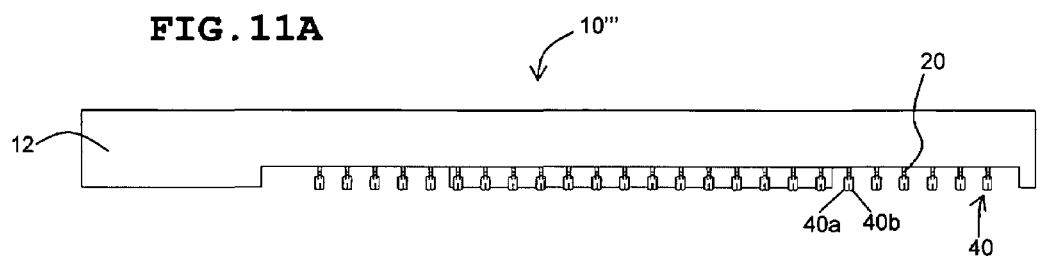
FIG. 11A is a side view of a connector for an IC chip according to another preferred embodiment of the present invention, which includes fusible member bearing contacts or terminals of preferred embodiments of the present invention.
Figure 11B:
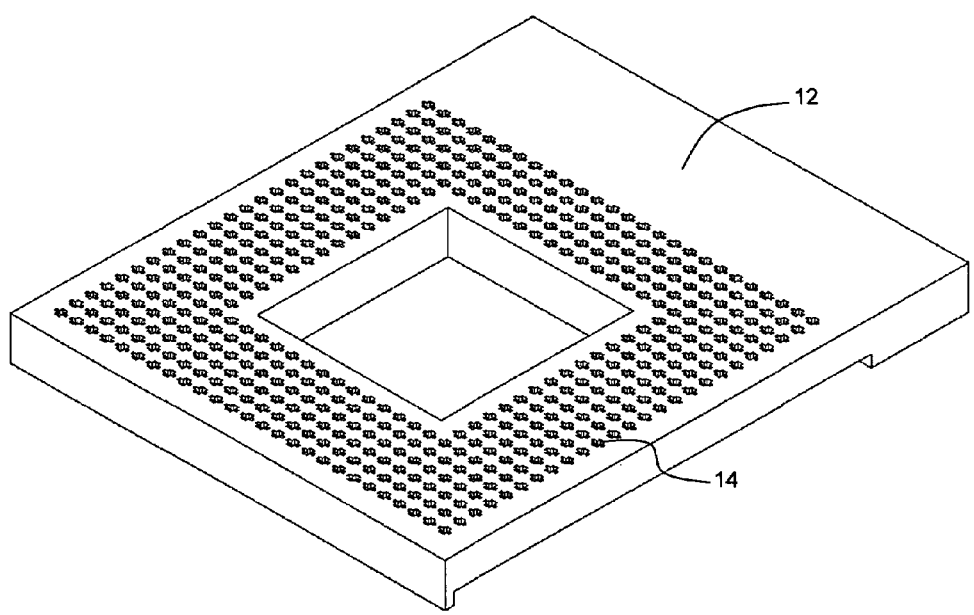
FIG. 11B is a top view of the connector of FIG. 11A.

The present invention can also be applied to other types of connectors including a single-ended array connector 10' or differential pair array connector 10' shown in FIG. 9, an edge card wafer 10" for use in a backplane connector as shown in FIG. 10, or a socket connector 10''' for use with an IC chip such as a microprocessor chip (e.g., a Pentium® socket connector) shown in FIGS. 11a and 11b.

It is possible to use standoffs, for example, element 90 shown in FIG. 9, to maintain desired spacing between the connector and PCB. Another advantage of using the standoff 90 is the standoff reduces the stress applied at the solder joint between the contacts 20 and the pads 62 on the PCB 60.

According to preferred embodiments of the present invention, the unique fusible member bearing contacts provided in the connector provide many advantages not achieved by conventional devices and overcome many problems not solved or recognized by the prior art.

The connector having the unique fusible member bearing contacts allows for greater co-planarity and a more reliable reflow process. Also, the manufacturing process of the connector according to preferred embodiments of the present invention is much easier, cheaper and reliable since no special equipment is required, a reflow step is eliminated, the contact or terminal does not require a right-angle portion at the tail to hold the fusible member, and the connector housing does not require special features in the connector body for locating and holding solder balls.

Furthermore, the method of attaching the fusible members to the contacts or terminals via the intermediate portion fitting in the unique key hole of the tail portions of the contacts or terminals and the unique construction of the two spaced opposed support portions being seated on a conductive pad or other attachment member, increases the strength of the solder joint, allows the contacts or terminals to be located much closer to the board or substrate upon which the connector is mounted, and allows the contacts or terminals to absorb more stress and flex more to avoid problems experienced by conventional connectors since the contacts or terminals are not rigidly held in the insulating body of the connector and are largely exposed from the insulating body.

As a result, the overall height of the connector according to preferred embodiments of the present invention is more controllable and even allows for flattening of the field of contacts with a flat rigid surface, if desired, which is not possible with BGA connectors without compromising the solder joint. Furthermore, the plastic or insulating connector body can be spaced farther from the solder joint which allows for better air flow below the connector. In addition, the problems with gold embrittlement, solder wicking and solder joint weakness are eliminated or reduced in the connector according to preferred embodiments of the present invention.

It should be noted that the preferred method of attaching the fusible members to the tails of the contacts or terminals has been described above. However, it is possible within the present invention to use alternative methods of attaching the fusible members to the contacts. In addition, the form, shape and arrangement of the support members can be changed as desired.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A contact for use with an electrical connector, the contact comprising:
    a contact portion located at a first end of the contact;
    a tail portion located at a second end of the contact; and
    a fusible member attached to the tail portion and including
        an intermediate portion and two support members disposed on opposite sides of the intermediate portion, and the two support members extend below the tail portion of the contact; wherein
    the two support members are arranged to move along the tail portion of the contact in a direction toward a connector body during a reflow process to allow the tail portion of the contact to drop down in a direction toward a substrate upon which the contact is to be mounted.

2. The contact according to claim 1, wherein each of the two support members extends below the tail portion of the contact by a distance of about 0.004 inches to about 0.014 inches.

3. The contact according to claim 1, wherein an outer periphery of each of the two support members is greater than an outer periphery of the tail portion of the contact.

4. The contact according to claim 1, wherein each of the two support members has one of a substantially flat bottom surface, a substantially rounded bottom surface, a substantially spherical bottom surface, a substantially conical bottom surface, a substantially rectangular bottom surface and a substantially square bottom surface.

5. The contact according to claim 1, wherein the tail portion is substantially straight and does not include a right angle portion.

6. The contact according to claim 1, further comprising wings for engaging a core of a connector body to maintain a uniform distance between the tail portion of the contact and the connector body.

7. The contact according to claim 1, further comprising wedges for engaging a side wall of a core of a connector body in order to fix the contact in the connector body.

8. The contact according to claim 1, further comprising lead-in portions having coined edges arranged to position the contact in a connector body.

9. The contact according to claim 1, further comprising bumps for positioning the contact within a connector body.

10. The contact according to claim 1, wherein the intermediate portion and the two support members are integral and unitary.

11. The contact according to claim 1, wherein the two support members are located on opposite sides of the tail portion of the contact.

12. The contact according to claim 1, wherein each of the two support members extends from the intermediate portion and are larger than the intermediate portion.

13. The contact according to claim 1, wherein the contact is made of a copper alloy.

14. The contact according to claim 1, wherein the tail portion includes two retaining arms holding the fusible member.

15. The contact according to claim 14, wherein each of the two retaining arms has a chamfered tip.

16. A contact for use with an electrical connector, the contact comprising:
   a contact portion located at a first end of the contact;
   a tail portion located at a second end of the contact; and
   a fusible member attached to the tail portion and including an intermediate portion and two support members disposed on opposite sides of the intermediate portion, and the two support members extend below the tail portion of the contact; wherein
   the tail portion includes a key hole defined by a first horizontally extending arc and two vertically extending arcs.

17. The contact according to claim 16, wherein the intermediate portion is fitted within the key hole.

18. The contact according to claim 16, wherein the intermediate portion fills the keyhole defined by the first horizontally extending arc and the two vertically extending arcs.

19. The contact according to claim 16, wherein each of the two support members extends below the tail portion of the contact by a distance of about 0.004 inches to about 0.014 inches.

20. The contact according to claim 16, wherein an outer periphery of each of the two support members is greater than an outer periphery of the tail portion of the contact.

21. The contact according to claim 16, wherein each of the two support members has one of a substantially flat bottom surface, a substantially rounded bottom surface, a substantially spherical bottom surface, a substantially conical bottom surface, a substantially rectangular bottom surface and a substantially square bottom surface.

22. The contact according to claim 16, wherein the tail portion is substantially straight and does not include a right angle portion.

23. The contact according to claim 16, further comprising wings for engaging a core of a connector body to maintain a uniform distance between the tail portion of the contact and the connector body.

24. The contact according to claim 16, further comprising wedges for engaging a side wall of a core of a connector body in order to fix the contact in the connector body.

25. The contact according to claim 16, further comprising lead-in portions having coined edges arranged to position the contact in a connector body.

26. The contact according to claim 16, further comprising bumps for positioning the contact within a connector body.

27. The contact according to claim 16, wherein the intermediate portion and the two support members are integral and unitary.

28. The contact according to claim 16, wherein the two support members are located on opposite sides of the tail portion of the contact.

29. The contact according to claim 16, wherein each of the two support members extends from the intermediate portion and are larger than the intermediate portion.

30. The contact according to claim 16, wherein the contact is made of a copper alloy.

31. The contact according to claim 16, wherein the tail portion includes two retaining arms holding the fusible member.

32. The contact according to claim 31, wherein each of the two retaining arms has a chamfered tip.

33. A contact for use with an electrical connector, the contact comprising:
   a contact portion located at a first end of the contact;
   a tail portion located at a second end of the contact;
   a fusible member attached to the tail portion and including an intermediate portion and two support members disposed on opposite sides of the intermediate portion, and the two support members extend below the tail portion of the contact;
   a medial portion located between the tail portion and the contact portion; and
   a solder stop portion located at the medial portion of the contact.

34. The contact according to claim 33, wherein each of the two support members extends below the tail portion of the contact by a distance of about 0.004 inches to about 0.014 inches.

35. The contact according to claim 33, wherein an outer periphery of each of the two support members is greater than an outer periphery of the tail portion of the contact.

36. The contact according to claim 33, wherein each of the two support members has one of a substantially flat bottom surface, a substantially rounded bottom surface, a substantially spherical bottom surface, a substantially conical bottom surface, a substantially rectangular bottom surface and a substantially square bottom surface.

37. The contact according to claim 33, wherein the tail portion is substantially straight and does not include a right angle portion.

38. The contact according to claim 33, further comprising wings for engaging a core of a connector body to maintain a uniform distance between the tail portion of the contact and the connector body.

39. The contact according to claim 33, further comprising wedges for engaging a side wall of a core of a connector body in order to fix the contact in the connector body.

40. The contact according to claim 33, further comprising lead-in portions having coined edges arranged to position the contact in a connector body.

41. The contact according to claim 33, further comprising bumps for positioning the contact within a connector body.

42. The contact according to claim 33, wherein the intermediate portion and the two support members are integral and unitary.

43. The contact according to claim 33, wherein the two support members are located on opposite sides of the tail portion of the contact.

44. The contact according to claim 33, wherein each of the two support members extends from the intermediate portion and are larger than the intermediate portion.

45. The contact according to claim 33, wherein the contact is made of a copper alloy.

46. The contact according to claim 33, wherein the tail portion includes two retaining arms holding the fusible member.

47. The contact according to claim 46, wherein each of the two retaining arms has a chamfered tip.

\* \* \* \* \*